United States Patent [19]

Leroux et al.

[11] Patent Number: 5,563,444
[45] Date of Patent: Oct. 8, 1996

[54] TRANSPORTABLE OBJECT AND PROCESS OF PRODUCTION

[75] Inventors: Gilles Leroux, Trainou; Simon Ormerod, Loury, both of France

[73] Assignee: Gilles Leroux, DS.A., Loury, France

[21] Appl. No.: 223,505

[22] Filed: Apr. 6, 1994

[30] Foreign Application Priority Data

Apr. 6, 1993 [FR] France .................. 93 04072

[51] Int. Cl.⁶ ................................. H01L 23/02
[52] U.S. Cl. .................. 257/679; 257/702; 257/730; 361/732
[58] Field of Search ................. 257/679, 678, 257/687, 701, 702, 704, 710, 711, 730, 731, 732, 778, 783, 726, 727; 361/732, 740

[56] References Cited

U.S. PATENT DOCUMENTS 5,013,900  5/1991  Hoppe ................. 257/679
5,233,500  8/1993  Liang et al. ............ 257/678

FOREIGN PATENT DOCUMENTS

469970A1  2/1992  European Pat. Off. .
2538930   7/1984  France .
2625350   6/1989  France .
1-25445   1/1989  Japan ................. 257/678

Primary Examiner—Jerome Jackson, Jr.
Assistant Examiner—John F. Guay
Attorney, Agent, or Firm—Nixon & Vanderhye

[57]  ABSTRACT

A transportable object having, in a plastic support, a cavity for receiving a micromodule unit containing a conductive chip with zones electrically insulated from one another and to which is electrically connected an integrated semiconductor circuit having at least a storage function. The cavity has a contour shaped in a sequence of contiguous arcs of small amplitude relative to a median contour line of a shape matched to the shape of the chip. The contour of the cavity forms a clearance angle of 10 degrees relative to a direction perpendicular to the surface of support.

29 Claims, 5 Drawing Sheets

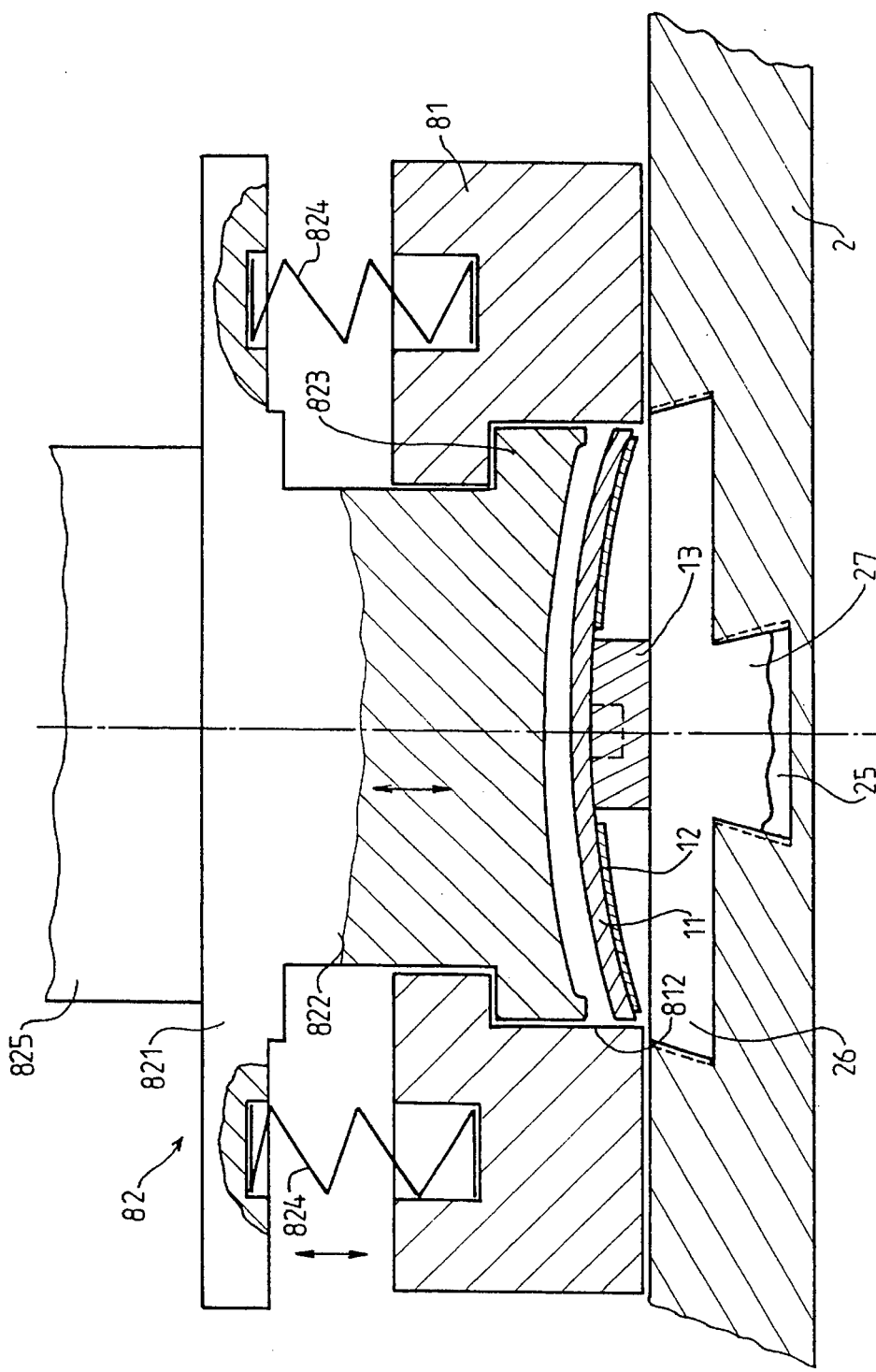

TRANSPORTABLE OBJECT AND PROCESS OF PRODUCTION

This invention relates to a transportable object and the process of production of such an object.

BACKGROUND OF THE INVENTION

Processes for production of transportable objects, such as microcircuit boards, are known, in which the chip-integrated circuit unit forming what one skilled in the art calls a switch or a micromodule is placed in a housing obtained by the assembly of several layers of plastic sheets, one of which is cut to the dimensions of the chip and at least one other layer to the dimensions of the integrated circuit. The various sheets are then joined to one another before the installation of the micromodule with a resin or an adhesive in the cavity thus constituted. This process is expensive because it comprises many steps.

Another process consists in heat-distorting a plastic sheet of greater thickness and inserting the switch unit there. This second process is detrimental to the semiconductor of the micromodule which is brought to a temperature at times too high, while the first process, which gives a good quality result, has the drawback of being too expensive.

Finally, the last inexpensive process consists in milling, in a plastic sheet of sufficient thickness, a housing intended to accommodate the switch and then attaching it in this housing with a resin. However, in this process, the available space between the switch and the cavity is large and the amount of adhesive to be used is considerable. The surface condition of the board resulting from the use of this process is relatively poor.

SUMMARY OF THE INVENTION

A first object of the invention is therefore to propose a transportable object whose surface condition, at the site of the zone between the contact chip and the board is of a superior quality and requires the use of less adhesive.

This object is achieved by the fact that, in a plastic support, the transportable object comprises a cavity intended to receive a micromodule unit comprising a conductive chip comprising zones electrically insulated from one another and to which is electrically connected an integrated semiconductor circuit comprising at least a storage function, characterized in that the cavity has a contour shaped by a sequence of contiguous arcs of small amplitude relative to a median contour line of a shape matched to the shape of the chip, said contour of the housing forming a clearance angle of 10 degrees relative to a direction perpendicular to the surface of the support.

According to another feature, the cavity comprises two recesses that are or are not concentric, of which a first, with a larger surface area than the second has a smaller depth than the second.

According to another feature, the first recess has a depth less than the sum of the thickness of the conductive chip and of the thickness of the thermofusible strip associated with the conductive chip.

According to another feature, the clearance angle and the depth of the first recess are calculated to absorb the volume of thermofusible adhesive corresponding to the difference of dimension between the depth of the first recess and the thickness of the chip-thermofusible strip unit.

According to another feature, the depth is less than 0.05 to 2 hundredths of a millimeter.

According to another feature, the depth is less than 2 hundredths of a millimeter.

According to another feature, the integrated circuit is attached in the second recess by a semi-flash set adhesive laden with elastomer.

According to another feature, the adhesive is of cyanoacrylic type.

According to another feature, the adhesive is a resin.

According to another feature, the chip is attached in a first housing by a thermofusible adhesive.

According to another feature, the ends of the arcs define a contour whose dimensions are, relative to the dimensions of the median contour line, reduced by a value between $1/1000$th and $10/1000$ths.

According to another feature, the dimensions are reduced preferably by $3/1000$ths.

Another object of the invention is to propose a process for production of the transportable objects according to the first object This object is achieved by the fact that the production process for the transportable objects comprises:

- a step of measuring, with a laser beam, the thickness of material forming the support of the board in which a cavity is to be made to receive the micromodule unit;
- a step of calculating the distance for lowering a miller spindle relative to a stationary plane constituted by the upper surface of the support forming the board;
- a step of controlling the movements of a milling cutter in a dovetail, whose dovetail corresponds to the clearance angle of the cavity, to form the contour shaped in a sequence of contiguous arcs;
- a step of bonding the micromodule unit on the support.

According to another feature, the bonding step comprises a step of depositing a defined amount of semi-flash set adhesive in the second recess of the cavity to assure the attachment of the integrated circuit to a semiconductor of the micromodule unit.

According to another feature, the bonding step further comprises a step of heating the conductive chip comprising zones electrically insulated from one another and provided with a thermofusible strip in an area surrounding the semiconductor.

According to another feature, the process comprises, before the attachment of the integrated semiconductor circuit, a step of depositing a thermofusible strip, provided with cuts of a sufficient size to surround the semiconductor, on the conductive strip that comprises a sequence of sliced conductive chips, each of which is electrically connected to a semiconductor and a step of separating the micromodule unit for installation in the cavity of the support.

According to another feature, the step of separating the micromodule unit is performed with a punch with a curved surface working with a matrix whose opening is obstructed by a receiving dish (81) intended to receive the mechanically deformed micromodule.

According to another feature, the micromodule unit positioned on a dish is brought to a station for installation in the cavity of the support to assure, by action of the pusher, the lowering of the micromodule into the cavity placed opposite the concavity of the dish whose size is less than that of the contour of the housing provided in support (2).

BRIEF DESCRIPTION OF THE DRAWINGS

Other features and advantages of this invention will come out more clearly from reading the description below given with reference to the accompanying drawings in which:

FIG. 3B represents a view in section of a fourth station making it possible to use the process.

DETAILED DESCRIPTION OF THE INVENTION

Figure 1A:
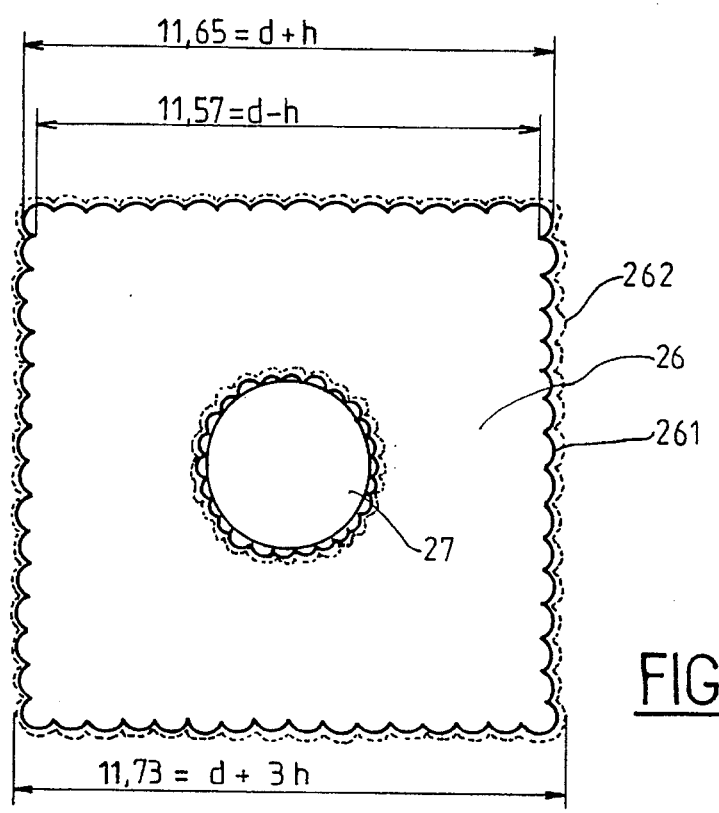
FIG. 1A represents a top view of the cavity formed in the support of the transportable object.

FIG. 1A represents a top view of contour (261) of a cavity formed in a plastic support, this contour of edge (261) of the cavity is shaped by a sequence of contiguous arcs thus defining a median line of contours whose shape corresponds in FIG. 1 to that of a square. These contiguous arcs have a height h=0.04 mm and a length l=0.5 mm, as represented in FIG. 1C. In FIG. 1B, it is possible to see that the upper edge formed on one side of contour (261) is placed, relative to the upper edge of the opposite contour, at a distance d−h=11.57 mm, which corresponds to dimension (d=11.61 mm) of conductive chip (11), as represented in FIG. 1D, and reduced by height (h) of the arc. The bottom of a first recess (26) forming the cavity is set back relative to upper edge (261) of this cavity to form a clearance angle of 10° relative to the upper surface of plastic sheet (2) forming the support of the transportable object. A second recess (27) rounds out the cavity, this second recess is or is not concentric relative to the first, with smaller surface area and greater depth than first recess (26). This second recess (27) also comprises a contour formed by a sequence of arcs of a circle to define a contour line (271) whose upper edge is offset relative to the bottom of the recess to form a clearance angle of 10°. The vertex of the arcs of an upper edge of first recess (26) is placed, relative to the vertex of the arcs of the other upper edge of the first recess, at a distance (d+h) corresponding to width (d) of the chip increased by height (h) of an arc. Finally, at the site of the bottom of first recess (26), the distance between the vertices of the arcs of opposite contour lines corresponds to width (d) of the chip increased by 3 times height (h) of an arc. Depth (p) of first recess (26) is less than the thickness of the unit of conductive chip (11)/ thermofusible strip (12) by a value that corresponds to $3/1000$ths of the sum of these thicknesses ($e_1$, or $e_2$). The particular configuration of edges (26) of the cavity makes it possible to achieve a "clipsage" phenomenon on edges (110) of chip (11) and the free spaces between edge (110) of chip (11), and the arcs delimiting the bottom of first recess (26) of the cavity make it possible to absorb the excess thermofusible adhesive when the upper surface of chip (11) is brought by heating into the plane of the upper surface of plastic part (2) forming the support of the board.

In an advantageous variant, edges (110) of the chip form a slant whose angle (b) with a perpendicular line to the surface of the contacts is at most equal to the clearance angle of recesses (26, 27).

Figure 2A:
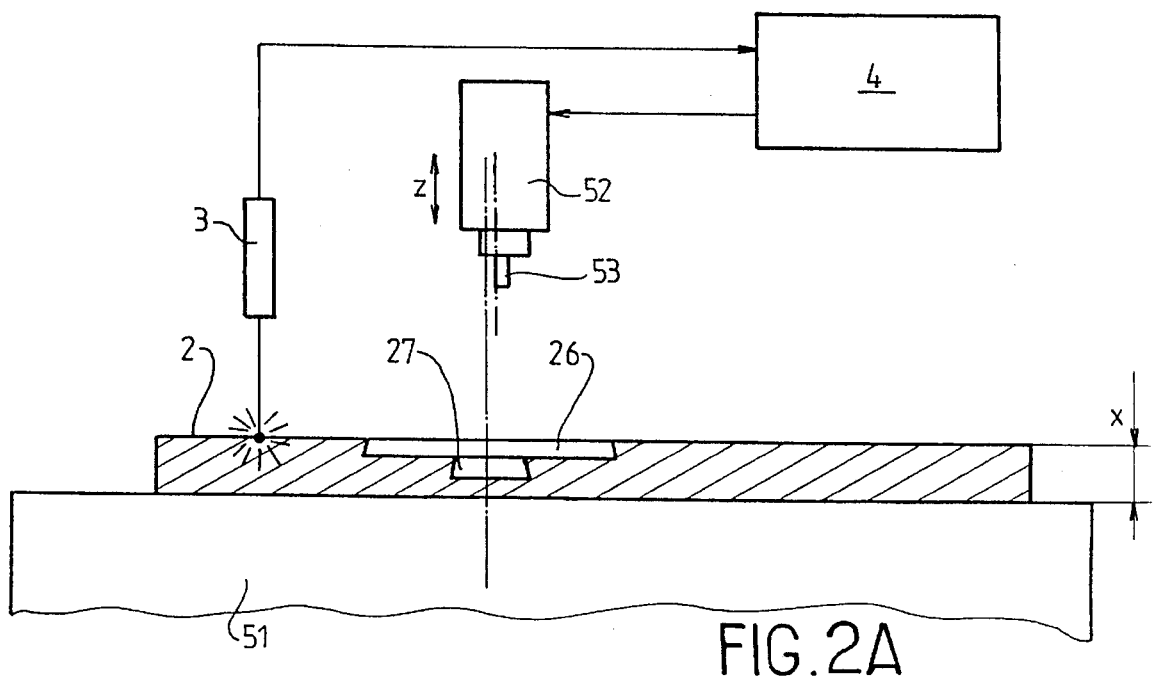
FIG. 2A represents a side view of a first station making it possible to use some of the steps of the process.
Figure 1B:
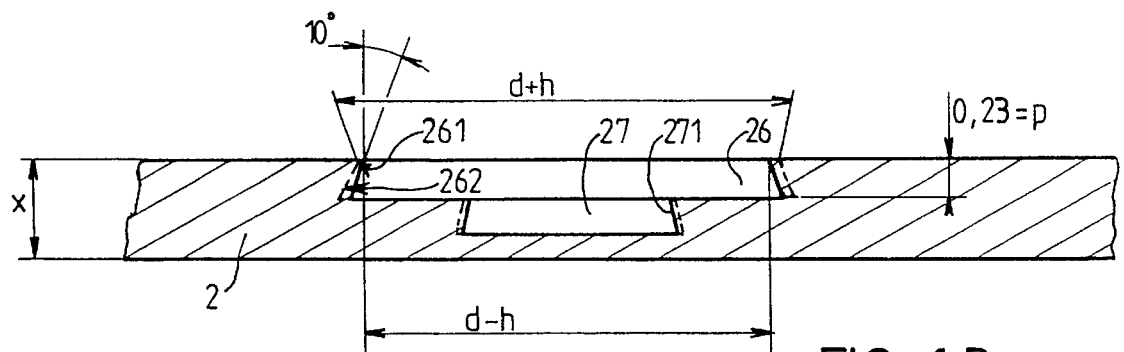
FIG. 1B represents a view in section of this same cavity formed in the support of the transportable object.
Figure 1C:
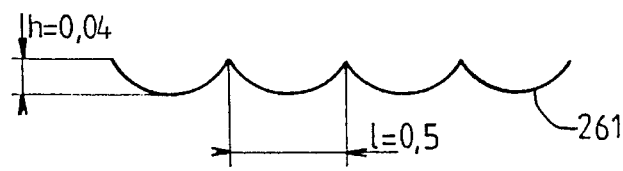
FIG. 1C represents a feature of the contour of the cavity.
Figure 1D:
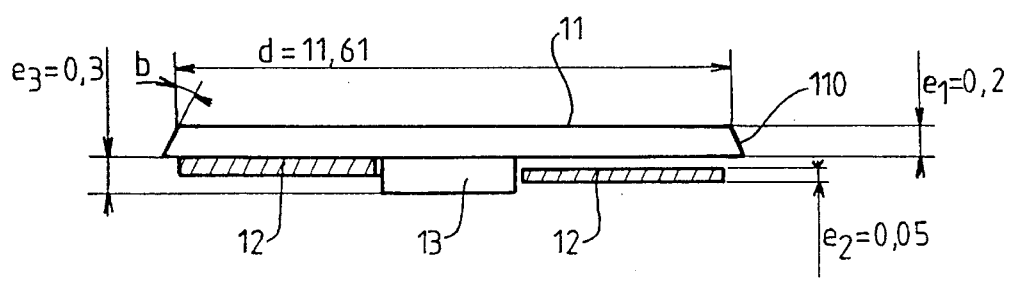
FIG. 1D represents a side view of a micromodule intended to be embedded in the cavity.
Figure 2B:
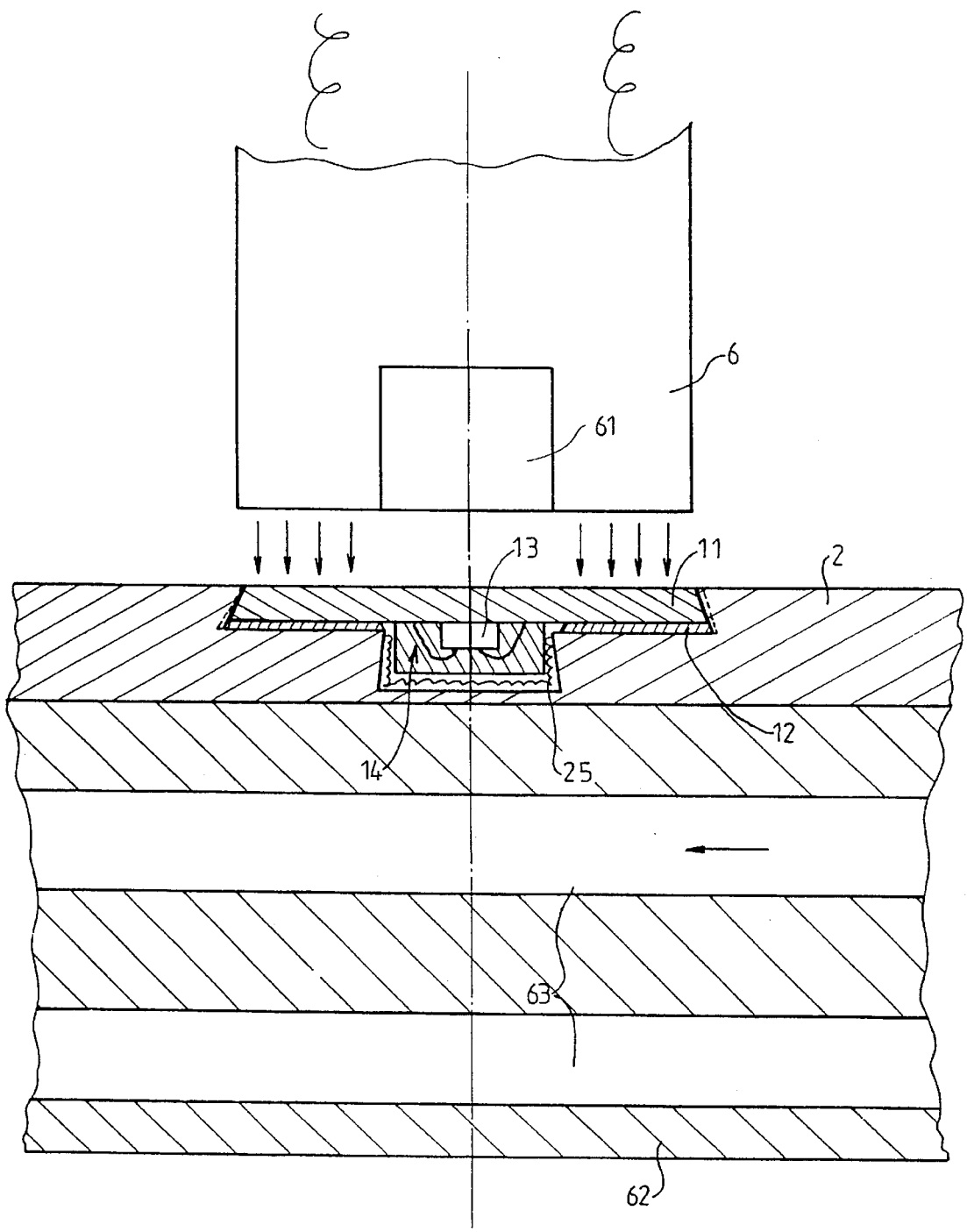
FIG. 2B represents a side view of a second station making it possible to use other steps of the process.

The transportable object, described in connection with FIGS. 1A to 1D, is produced by the process explained with FIGS. 2A and 2B. This process comprises a first step used on the device represented in FIG. 2A, which consists in measuring the thickness of support (2) forming the board with a laser (3) that send the measurement data to a digital control device (4) to control accordingly the motion of milling head (52) at the end of which is placed a milling cutter (53) in a dovetail whose clearance forms an angle of 10° relative to the vertical. The vertical motion of milling cutter (z) is controlled by digital control (4) as a function of the measurement of thickness (x) performed by laser (3) so that depth (p) of first recess (26) of the cavity corresponds exactly to the desired depth, on the one hand and, on the other hand, so that the dimensions of the contour of the first recess of the cavity also correspond to the desired values. Then, digital control (4) controls the motion of milling head (52) to produce second recess (27). Once this operation is performed, support (2) forming a board is brought to a second station represented in FIG. 2B, after having been provided, at an intermediate station, with a micromodule unit (11, 12, 13) formed by a conductive chip (11), comprising electrically insulated zones and conductive zones of a semiconductor (13) and a strip (12). An electronic semiconductor component (13), which is itself electrically connected to the various conductive zones of this conductive chip, is mounted on chip (11), as is known to one skilled in the art. A thermofusible chip (12) comprising, at the site corresponding to that of semiconductor (13), an orifice clearing the passage for the semiconductor, is placed on each chip (11).

Figure 3A:
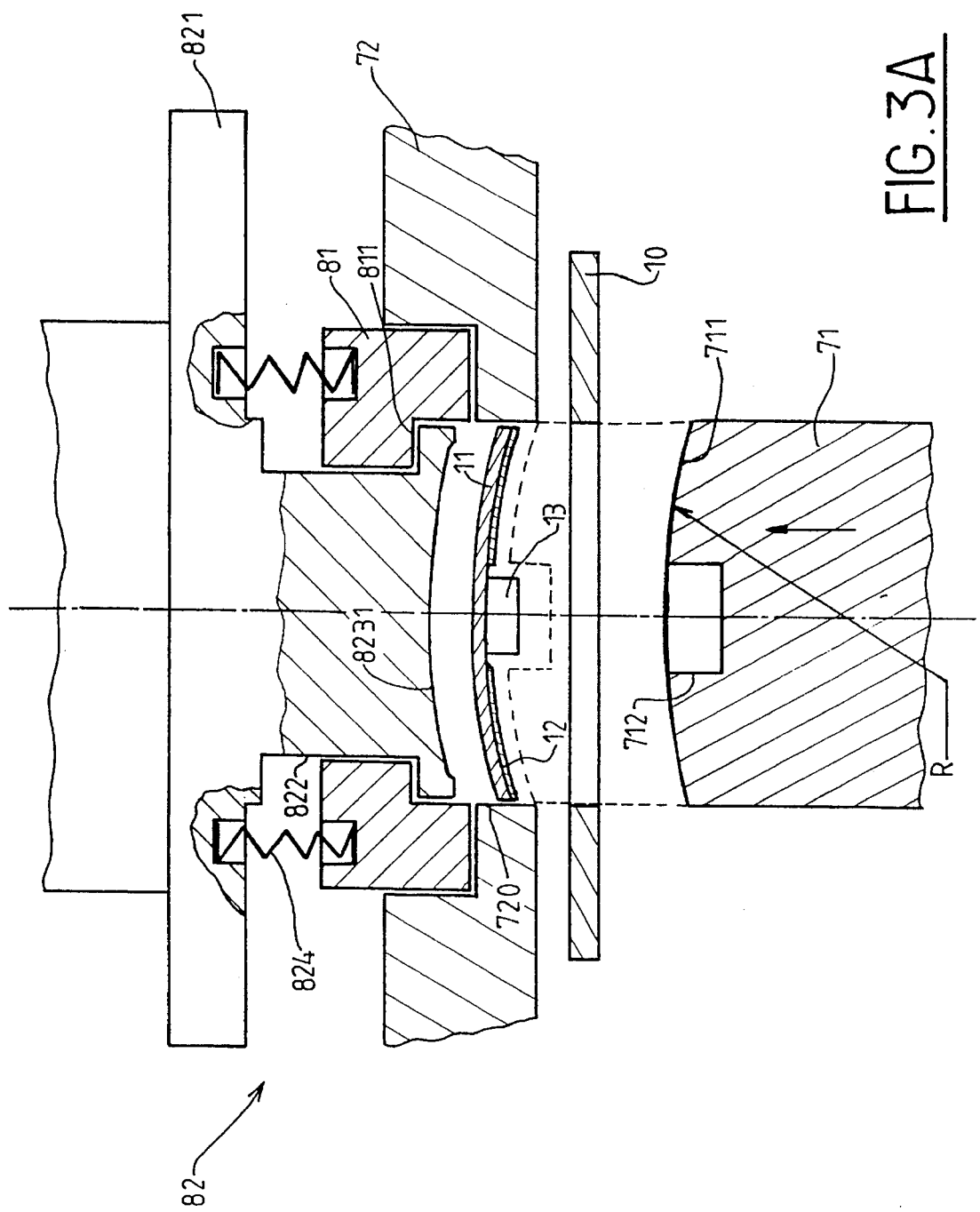
FIG. 3A represents a view in section of a third station making it possible to use a variant of the process.

Micromodule (11, 12, 13) is prepared from a strip (10) comprising conductive zones and electrically insulated zones and on which semiconductors (13) and thermofusible strip (12) will have been placed. This strip (10) will be cut into a micromodule by cuts at regular intervals made by a punch (71) whose front face comprises a recess (712) to prevent the crushing of semiconductor (13) and forms a curved surface (711), preferably either cylindrical, or in the shape of a spherical cap. In encountering strip (10), this punch will deform the latter and bring it to rest on matrix (72) of the cutting tool to cut micromodule (11, 12, 13) represented in solid lines in FIG. 3A. The forward travel of punch (71) will push the micromodule into a receiving dish (81) located on the other side of matrix (72) and in which is mounted a pusher made of a plate (821), a cylindrical part (822) and a concave surface (8231) formed on a wafer (823) placed at the lower end of cylinder (822), so that wafer (823) rests on shoulders (811) of the receiving dish when springs (824) expand. Punch (71) with a spherical surface of radius (R) or with a cylindrical surface of the same radius, makes it possible to obtain micromodules comprising, according to the variant of FIG. 1D, a slanted edge (110). This micromodule (11, 12, 13) will be held in receiving dish (81) by undergoing a mechanical deformation which gives it a swell, as represented in FIG. 3A.

The unit of receiving dish (81)-pusher tool (82), and micromodule (11, 12, 13), held fast in receiving dish (81), is then brought to a fourth station, represented in FIG. 3B. At this fourth station, a support element (2), precut in board form and in which cavities (26, 27) have been made, is placed opposite dish (81) and pusher tool (82). This pusher tool (82) is driven downward by a descending rod (825) that causes the motion of concave pusher (823) thus assuring the lowering of the micromodule into housing (26, 27). In FIG. 3B, it is possible to make it so that the distance separating vertical walls (812) from dish (81) is less than the dimensions of first recess (26) made in support (2) of the board, to make possible an easy installation of the micromodule in its housing thus assuring the self-centering of the micromodule in recess (26) when the micromodule naturally comes back to being flat after being removed from dish (81). This installation of micromodule (11, 12, 13) makes it possible to avoid having to position the housing, precisely made in advance on the milling machine with a very great precision, under the insertion tool to maintain a high insertion quality. Further, the use of a curved punch makes it possible to obtain slanted edges (110), as represented in FIG. 1D.

In a variant embodiment, it could be considered to use a punch with flat front face (711) with recess (712) and to cut the micromodule with a matrix (72) whose size corresponds to that of first recess (26) near the cutting surface and whose internal surfaces (720) would taper, making it possible to bring the micromodule gradually, by deformation, to the dimensions of dish (81) for transport of the micromodule to the next station. In this case, the edges of the micromodules would not be slanted.

Before installing the switch or the module thus formed, the production machine will have deposited in advance a drop of adhesive (25), made either of a resin or of a cyanoacrylic adhesive, to perform a semi-rapid attachment of the integrated circuit in housing (27) of board (2). Then, in the station of FIG. 2B, the board is positioned on a reference support (62), which, in the zone corresponding to the site of micromodule (11, 12, 13), comprises a cooling air duct (63) formed in support (62). Opposite this referenced support (62) is placed a head (6) comprising heating electrodes that can be parameterized. This head (6) is itself provided in its center with a housing (61) filled with non-heat-conducting material to prevent a heating of the central zone of the micromodule corresponding to that where the integrated circuit is located on the back. Heating head (6) is lowered, then applied with a certain pressure to the micromodule unit, on the one hand, to perform the fusion of thermofusible strip (12) and, on the other hand, by the pressure, to cause the evacuation of excess thermofusible adhesive toward the arcs of the cavity.

The advantage of the process is that the switch unit installed in the cavity does not run the risk of escaping from the latter during a quick and sudden transfer from one work station to another station, for example, from the station for installing the micromodule toward the next pressing station.

The process also makes it possible to hold the chip by "clipsage" on the one hand to improve the appearance of the insertion and, on the other hand, to use other means of adhesion than those currently used.

Thanks to this "clipsage" effect, there is no requirement to use flash set adhesives (2 to 20 seconds), offering resistance to shearing on steel of 14 to 22 MPA less effective than that with semi-flash set (10 seconds to 2 minutes) resistant to peeling, to shocks and laden with elastomer, offering characteristics of flexibility, of resiliency and a resistance to shearing on steel of 22 to 30 MPA. This adhesive quality can also be applied to the adhesion of the chip.

Further, this process has the advantage of making it possible to constitute a natural reservoir of excess adhesive to prevent a trimming operation and also to assure a better bonding of the chip to the support thanks to this toothing which in short resembles a straight knurling. The undercut also offers the advantage, once the adhesive has hardened, of allowing the lifting of the micromodule or of the chip only when breaking the board.

It is quite obvious that the invention has been represented with a cavity having a square-shaped median contour but that it also applies for all the median contour lines of rectangular, round, oblong shape and for all thicknesses of the chip and of the thermofusible strip.

Other modifications within reach of one skilled in the art are also part of the spirit of the invention.

We claim:

1. Transportable object comprising, in a plastic support having a surface, a cavity for receiving a micromodule unit comprising a conductive chip comprising zones electrically insulated from one another and to which is electrically connected an integrated semiconductor circuit comprising at least a storage function, said cavity having a contour shaped in a sequence of contiguous arcs of small amplitude relative to a median contour line of a shape matched to the shape of said chip, said contour of said cavity forming a clearance angle of 10 degrees relative to a direction perpendicular to said surface of said plastic support.

2. Transportable object according to claim 11, wherein said cavity comprises first and second recesses, said first recess having a greater surface area than said second recess and having a smaller depth than said second recess.

3. Transportable object according to claim 2, wherein said recesses are concentric.

4. Transportable object according to claim 2, wherein said recesses are non-concentric.

5. Transportable object according to claim 2, wherein said first recess has a depth less than the sum of thickness ($e_1$) of said conductive chip and of thickness ($e_2$) of a thermofusible strip associated with said conductive chip.

6. Transportable object according to claim 5, wherein said clearance angle and depth of said first recess are calculated to accommodate a volume of thermofusible adhesive corresponding to the difference in dimension between the depth of said first recess and thickness ($e_1+e_2$) of said conductive chip and said thermofusible strip.

7. Transportable object according to claim 5, wherein said depth of said first recess is less than 0.05 to 2 hundredths of a millimeter.

8. Transportable object according to claim 7, wherein said depth is less than 2 hundredths of a millimeter.

9. Transportable object according to claim 2, wherein said integrated circuit is attached in said second recess by a semi-flash set adhesive containing elastomer.

10. Transportable object according to claim 9, wherein said adhesive is a cyanoacrylic type adhesive.

11. Transportable object according to claim 9, wherein said adhesive is a resin.

12. Transportable object according to claim 11, wherein said chip is attached in said cavity by a thermofusible adhesive.

13. Transportable object according to claim 1, wherein the ends of said arcs define a contour whose dimensions, relative to the dimensions of the median contour line, are reduced by a value between 1/1000ths and 10/1000ths.

14. Transportable object according to claim 13, wherein the dimensions are reduced by 3/1000ths.

15. Transportable object comprising, in a plastic support having a surface, a cavity for receiving a micromodule unit comprising a conductive part comprising zones electrically insulated from one another and to which is electrically connected an integrated semiconductor circuit, comprising at least a storage function, said conductive part being formed with a dovetail on at least two opposite sides, said cavity having at least two opposite sides forming a dovetail for receiving said conductive part, said two opposite sides having a clearance angle of 10 degrees relative to a direction perpendicular said surface of said support.

16. Transportable object according to claim 15, wherein said cavity has a contour shaped in a sequence of contiguous arcs of small amplitude relative to a median contour line of a shape matched to the shape of said conductive part.

17. Transportable object according to claim 15, wherein said cavity comprises first and second recesses, said first recess having a greater surface area than said second recess and having a smaller depth than said second recess.

18. Transportable object according to claim 17, wherein said recesses are concentric.

19. Transportable object according to claim 17, wherein said recesses are non-concentric.

20. Transportable object according to claim 17, wherein said first recess has a depth less than the sum of thickness ($e_1$) of said conductive part and of thickness ($e_2$) of a thermofusible strip associated with said conductive part.

21. Transportable object according to claim 17, wherein said clearance angle and depth of said first recess are calculated to accommodate a volume of thermofusible adhesive corresponding to the difference in dimension between said depth of said first recess and thickness ($e_1+e_2$) of said conductive part and said thermofusible strip.

22. Transportable object according to claim 20, wherein said depth of said first recess is less than 0.05 to 2 hundredths of a millimeter.

23. Transportable object according to claim 22, wherein said depth is less than 2 hundredths of a millimeter.

24. Transportable object according to claim 17, wherein said integrated circuit is attached in said second recess by a semi-flash net adhesive containing elastomer.

25. Transportable object according to claim 24, wherein said adhesive is a cyanoacrylic type adhesive.

26. Transportable object according to claim 24, wherein said adhesive is a resin.

27. Transportable object according to claim 15, wherein said conductive part is attached in a first housing by a thermofusible adhesive.

28. Transportable object according to claim 15, wherein the ends of the arcs define a contour whose dimensions, relative to the dimensions of the median contour line, are reduced by a value between $1/1000$ths and $10/1000$ths.

29. Transportable object according to claim 28, wherein the dimensions are reduced by $3/1000$ths.

* * * * *